United States Patent
Konrath et al.

(10) Patent No.: US 10,014,383 B2
(45) Date of Patent: Jul. 3, 2018

(54) METHOD FOR MANUFACTURING A SEMICONDUCTOR DEVICE COMPRISING A METAL NITRIDE LAYER AND SEMICONDUCTOR DEVICE

(71) Applicant: Infineon Technologies AG, Neubiberg (DE)

(72) Inventors: Jens Peter Konrath, Villach (AT); Hans-Joachim Schulze, Taufkirchen (DE); Reinhold Schoerner, Grossenseebach (DE)

(73) Assignee: Infineon Technologies AG, Neubiberg (DE)

( * ) Notice: Subject to any disclaimer, the term of this patent is extended or adjusted under 35 U.S.C. 154(b) by 53 days.

(21) Appl. No.: 14/572,872

(22) Filed: Dec. 17, 2014

(65) Prior Publication Data

US 2016/0181388 A1 Jun. 23, 2016

(51) Int. Cl.
*H01L 29/47* (2006.01)
*H01L 29/872* (2006.01)
(Continued)

(52) U.S. Cl.
CPC .......... *H01L 29/47* (2013.01); *H01L 21/0495* (2013.01); *H01L 21/28537* (2013.01);
(Continued)

(58) Field of Classification Search
CPC . H01L 29/47; H01L 29/872; H01L 29/66143; H01L 21/22; H01L 21/2236; H01L 21/28537; H01L 21/02678; H01L 21/266; H01L 21/0465; H01L 21/426; H01L 21/0268; H01L 21/0495;
(Continued)

(56) References Cited

U.S. PATENT DOCUMENTS

| 4,173,063 A | * | 11/1979 | Kniepkamp | ...... H01L 21/26546 |
| | | | | 148/DIG. 100 |
| 4,545,826 A | * | 10/1985 | McCunn | ................ C21D 6/004 |
| | | | | 148/542 |

(Continued)

FOREIGN PATENT DOCUMENTS

KR    20060112387 A  *  11/2006

OTHER PUBLICATIONS

Min, Kyung-Hoon et al., "Comparative study of tantalum and tantalum nitrides (Ta2N and TaN) as a diffusion barrier for Cu metallization", Sep./Oct. 1996, Journal of Vacuum Science & Technology B 14, No. 5, pp. 3263-3269.*
(Continued)

*Primary Examiner* — Yu Chen
*Assistant Examiner* — Pauline Vu
(74) *Attorney, Agent, or Firm* — Murphy, Bilak & Homiller, PLLC

(57) ABSTRACT

A method of manufacturing a semiconductor device includes introducing nitrogen into a metal layer or into a metal nitride layer, the metal layer or metal nitride layer being formed in contact with a semiconductor material. A semiconductor device includes a semiconductor material and a metal nitride layer in contact with the semiconductor material. The metal nitride has a nitrogen content larger than a solubility limit of nitrogen in the metal nitride.

21 Claims, 7 Drawing Sheets

(51) Int. Cl.
  *H01L 29/66*      (2006.01)
  *H01L 21/285*     (2006.01)
  *H01L 21/04*      (2006.01)
  *H01L 29/06*      (2006.01)
  *H01L 21/3215*    (2006.01)
  *H01L 21/02*      (2006.01)
  *H01L 21/223*     (2006.01)
  *H01L 21/266*     (2006.01)
  *H01L 21/268*     (2006.01)
  *H01L 29/16*      (2006.01)
  *H01L 29/20*      (2006.01)
  *H01L 29/22*      (2006.01)

(52) U.S. Cl.
  CPC .... *H01L 21/28581* (2013.01); *H01L 21/3215* (2013.01); *H01L 29/0619* (2013.01); *H01L 29/475* (2013.01); *H01L 29/6606* (2013.01); *H01L 29/66143* (2013.01); *H01L 29/872* (2013.01); *H01L 29/1602* (2013.01); *H01L 29/1608* (2013.01); *H01L 29/20* (2013.01); *H01L 29/2003* (2013.01); *H01L 29/22* (2013.01)

(58) Field of Classification Search
  CPC ......... H01L 21/28581; H01L 21/02614; H01L 29/0619; H01L 29/6606; H01L 21/3215; H01L 29/22; H01L 29/2003; H01L 29/20; H01L 29/0615
  See application file for complete search history.

(56) References Cited

U.S. PATENT DOCUMENTS

| | | | | |
|---|---|---|---|---|
| 5,010,032 A * | 4/1991 | Tang | ................. | H01L 21/31111 148/DIG. 147 |
| 5,508,212 A * | 4/1996 | Wang | ................. | H01L 29/6659 257/E21.165 |
| 5,801,097 A * | 9/1998 | Chang | ............... | H01L 21/76856 257/E21.584 |
| 7,727,882 B1 * | 6/2010 | Wu | .................... | H01L 21/2855 257/E21.584 |
| 7,851,831 B2 * | 12/2010 | Koyama | ............... | H01L 29/812 257/267 |
| 2001/0015463 A1 * | 8/2001 | Wakabayashi | .... | H01L 21/28088 257/371 |
| 2002/0003918 A1 * | 1/2002 | Ooi | ........................ | B82Y 20/00 385/14 |
| 2002/0031877 A1 * | 3/2002 | Arai | .................... | H01L 21/2652 438/167 |
| 2002/0058163 A1 * | 5/2002 | Uzoh | .................. | C23C 14/0084 428/698 |
| 2002/0127882 A1 * | 9/2002 | Chen | ................. | H01L 21/26506 438/787 |
| 2004/0005749 A1 * | 1/2004 | Choi | ..................... | H01L 21/265 438/197 |
| 2004/0129960 A1 * | 7/2004 | Maruyama | .......... | H01L 27/1214 257/288 |
| 2004/0188755 A1 * | 9/2004 | Tarui | .................. | H01L 21/0465 257/328 |
| 2004/0251140 A1 * | 12/2004 | Chung | ..................... | C25D 3/42 205/50 |
| 2005/0085004 A1 * | 4/2005 | Lai | ........................ | H01L 21/314 438/100 |
| 2005/0194610 A1 * | 9/2005 | Souma | ............. | H01L 29/66143 257/133 |
| 2006/0270200 A1 * | 11/2006 | Shibata | ................... | C30B 25/04 438/481 |
| 2007/0241458 A1 * | 10/2007 | Ding | ..................... | C23C 14/024 257/751 |
| 2009/0179297 A1 * | 7/2009 | Stewart | ................. | H01L 29/872 257/475 |
| 2010/0181546 A1 * | 7/2010 | Yamamoto | .......... | H01L 45/1233 257/2 |
| 2012/0043551 A1 * | 2/2012 | Zhu | .................. | H01L 21/28581 257/76 |
| 2013/0126815 A1 * | 5/2013 | Kim | ....................... | H01L 45/06 257/2 |
| 2013/0292790 A1 * | 11/2013 | Minoura | ............. | H01L 27/0814 257/471 |
| 2015/0325667 A1 * | 11/2015 | Donkers | | |
| 2016/0056260 A1 * | 2/2016 | Maeyama | ......... | H01L 29/66136 438/478 |

OTHER PUBLICATIONS

Liu, Yongxun et al., "Investigation of the TiN gate electrode with tunable work function and its application for FinFET fabrication", Nov. 2006, Nanotechnology, IEEE Transactions on 5, No. 6, pp. 723-730.*

* cited by examiner

METHOD FOR MANUFACTURING A SEMICONDUCTOR DEVICE COMPRISING A METAL NITRIDE LAYER AND SEMICONDUCTOR DEVICE

BACKGROUND

Schottky diodes comprising a metal-semiconductor junction are generally used as rectifying devices. In particular, SiC Schottky diodes are increasingly used in the field of power electronics.

SUMMARY

It is an object of the present invention to provide an improved method for manufacturing a semiconductor device comprising a metal-semiconductor junction. Further, it is an object to provide such a semiconductor device comprising a metal-semiconductor junction.

According to an embodiment, a method of manufacturing a semiconductor device comprises introducing nitrogen into a metal nitride layer or into a metal layer, the metal nitride layer or metal layer being formed in contact with a semiconductor material.

According to an embodiment, a semiconductor device comprises a semiconductor material and a metal nitride layer in contact with the semiconductor material. The metal nitride has a nitrogen content larger than a solubility limit of nitrogen in the metal nitride.

According to an embodiment, an electrical component comprises the semiconductor device as described above, wherein the electrical component is selected from the group consisting of a Schottky diode, a merged Schottky diode, a junction barrier Schottky diode, a JFET, an integrated flyback diode, a rectifier, an inverter, and a power supply.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

Figure 1A:
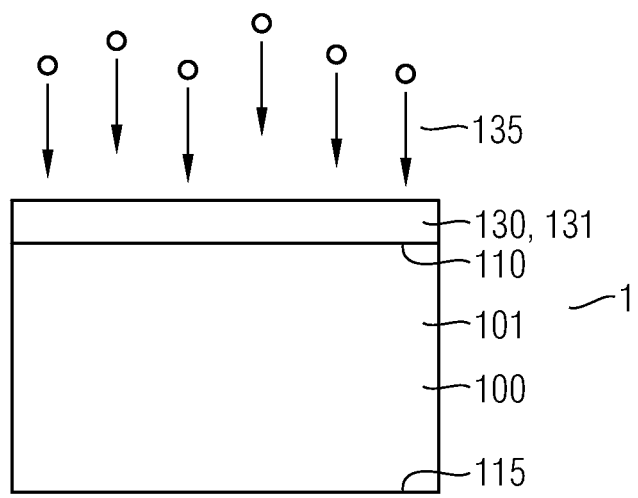
FIG. 1A illustrates a method according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, diamond, silicon carbide (SiC) or gallium nitride (GaN) may form the semiconductor substrate material.

The Figures and the description illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-resistive electric connection between the elements electrically connected together.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

FIG. 1A illustrates a method according to an embodiment. A workpiece 1 may comprise a semiconductor material 100 and a metal nitride layer 130 or metal layer 131 formed on a first main surface 110 of the semiconductor material. The metal nitride layer 130 or metal layer 131 is formed in contact with the semiconductor material 100. For example, the semiconductor material 100 may be a portion of a semiconductor substrate 101. According to a further implementation, the semiconductor material 100 may be an arbitrary semiconductor layer formed over a arbitrary substrate (not illustrated). The semiconductor material 100 may comprise further doped portions (not illustrated in this drawing). The method according to an embodiment comprises introducing nitrogen 135 into the metal nitride layer 130 or metal layer 131.

For example, the metal nitride or metal comprises a metal selected from the group consisting of molybdenum, titanium, tantalum, and tungsten. It has been found out, that due to the process or introducing nitrogen ions 135, the nitrogen content of the metal nitride layer 130 may be increased in comparison to a method without introducing nitrogen ions. If the nitrogen ions 135 are introduced into the metal layer 131, a metal nitride layer 130 having an increased nitrogen content is formed. Using conventional methods of forming a metal nitride layer, e.g. by reactive sputtering, the upper limit of the nitrogen content is determined by the limit of solubility of nitrogen in the metal nitride. This limit may for example depend on the metal used. For example, for MoN, the upper limit of nitrogen content may be 47.5 to 48 at-% without performing the special process of introducing nitrogen (doping process). Due to the process of introducing nitrogen, the nitrogen content may be increased. As a consequence, according to an embodiment, the nitrogen content may be larger than approximately 48 at-%, e.g. larger than 50 at-%. According to a further embodiment, the nitrogen content may be larger than 55 at-% or larger than 60 at-%.

By changing the nitrogen content of the metal nitride layer, the work function of the metal nitride layer may be changed. Due to the changed work function of the metal nitride layer, the height of the Schottky barrier and thus, a forward voltage drop may be changed due to the changed height of the Schottky barrier. For example, by increasing the nitrogen content of the metal nitride layer, the work function of the metal nitride layer may be decreased. As a result, the Schottky barrier and, thus, the forward voltage drop of a Schottky contact between semiconductor material 100 and metal nitride layer 130 may be reduced.

For example, the semiconductor material 100 may have a bandgap larger than 2 eV and less than 10 eV, e.g. less than 6 eV. Examples of the semiconductor material 100 comprise silicon carbide, aluminium nitride, indium phosphide, AlGaAS, diamond and further examples of III-V semiconductors. For example, a non-ohmic contact, e.g. a Schottky contact is formed between the semiconductor material 100 and the metal nitride layer 130. According to a further embodiment, an ohmic contact may be formed between the semiconductor material 100 and the metal nitride layer 130.

Figure 1B:
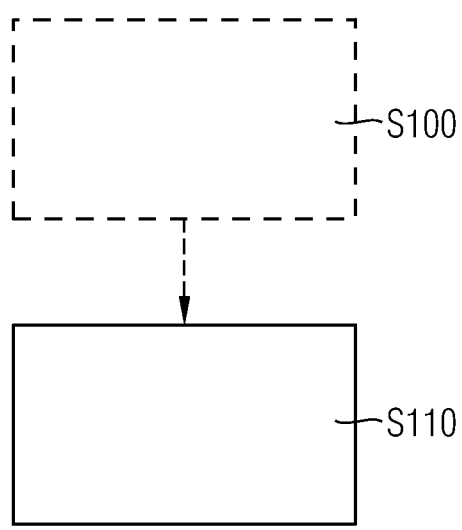
FIG. 1B summarizes steps of a method according to an embodiment.

FIG. 1B summarizes the method according to an embodiment. The method comprises introducing nitrogen into a metal nitride layer or metal layer, the metal nitride layer or metal layer being formed in contact with the semiconductor material (S110). For example, the method may further comprise providing a semiconductor material in contact with a metal nitride layer (S100). For example, a pre-processed workpiece may be provided and may be doped with nitrogen. For example, the pre-processed workpiece may comprise a metal or metal nitride layer on a semiconductor material. According to a further embodiment, the method may comprise forming a metal nitride layer over a semiconductor substrate and, thereafter, introducing nitrogen into the metal nitride layer. Alternatively, the method may comprise forming a metal layer over a semiconductor substrate, and, thereafter, introducing nitrogen into the metal layer. By way of example, forming the metal nitride layer by introducing nitrogen into a metal layer may be accomplished in cases in which a sputtering process would not be compatible with previously performed surface treatment processes of treating the semiconductor substrate.

Introducing nitrogen into the metal or metal nitride layer may be accomplished using an arbitrary method as is generally known. For example, nitrogen may be introduced used an ion implantation method as will be explained later. According to a further embodiment, nitrogen may be introduced using a plasma assisted doping process, which will be explained later. Generally, a typical implantation dose is $10^{15}$ to $10^{16}$ cm$^2$. A typical implantation energy is 30 keV to 100 keV.

The process of introducing nitrogen, e.g. implantation process, may be performed so as to obtain a homogeneous distribution of the penetration depth of the nitrogen ions. For example, this may be accomplished by performing a post-implantation treatment. For example, the workpiece 1 may be subjected to an annealing process of heating the workpiece to an elevated temperature, e.g. 200 to 500° C.

According to a further embodiment, this treatment may as well be performed using a laser treatment process, e.g. a laser annealing process which locally melts the metal nitride layer. For example, an IR laser may be used for performing this annealing process at a power of several 10 W/cm$^2$. According to an embodiment, a laser process may be used which does not melt the metal nitride layer.

By adjusting the profile of the penetration depth, the nitrogen ions 135 may be distributed in the metal nitride layer in a more homogenous manner, resulting in a homogeneous distribution of the work function of the metal nitride layer and, thus, a homogeneous barrier height of the Schottky barrier.

Figure 2A:
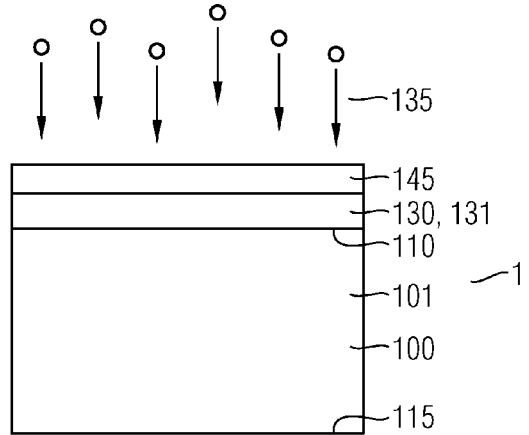
FIG. 2A illustrates a method according to a further embodiment.

FIG. 2A illustrates a workpiece 1 when performing a method according to a further embodiment. The embodiment of FIG. 2A differs from the embodiment shown in FIG. 1A in that a thin silicon oxide layer 145 is disposed over the metal nitride layer 130. For example, the silicon oxide layer 145 may have a thickness of 40 to 60 nm. For example, this layer may be formed using a plasma enhanced chemical vapour deposition (PECVD) method. This thin silicon oxide layer 145 causes scattering of the nitrogen ions, resulting in a broadening of the distribution of momenta of the nitrogen ions. Thereby, the distribution of the penetration depth of the nitrogen ions may also be broadened. For example, when using the thin silicon oxide layer 145, a homogeneous distribution of the penetration depth may be achieved without performing a subsequent temperature or annealing step.

Figure 2B:
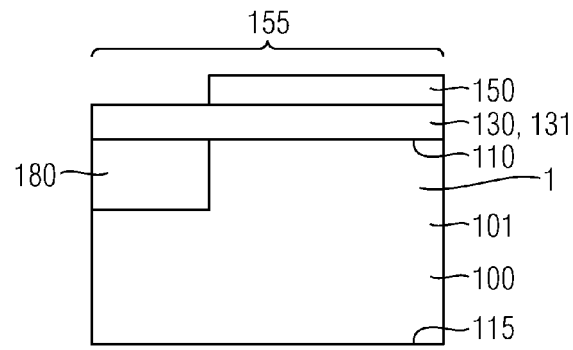
FIG. 2B illustrates a semiconductor substrate when performing a method according to a further embodiment.

FIG. 2B shows a further embodiment according to which a portion of the surface of the metal nitride layer 130 may be masked using a suitable masking material. For example, a photoresist layer may be used as an implantation mask. Alternatively, a patterned silicon oxide layer having a thickness of about 1 to 1.5 µm may be employed. By using a mask 155, the work function of the metal nitride layer 130 and thus the barrier height of the Schottky barrier may be locally varied. FIG. 2B further shows a semiconductor material portion 180 which may be doped with a conductivity type that is different from the conductivity type of the semiconductor material 100. For example, the semiconductor material 100 may be n-doped, and the doped portion 180 may be p-doped. The masking material 150 may be disposed so as to cover the surface of the metal nitride layer adjacent to the n-doped portion, while leaving the surface of the metal nitride layer 130 adjacent to the p-doped portion 180 uncovered. When thereafter a process of introducing nitrogen is performed, only the portion of the metal nitride layer 130 adjacent to the p-doped portion 180 may be doped, resulting in a change of the nitrogen content of the metal nitride layer and, thus, the work function of the metal nitride layer. According to an embodiment, the nitrogen ions may also be introduced into the covered portion of the metal nitride layer 130 may be doped with nitrogen ions, at a lower concentration than the uncovered portions of the metal nitride layer 130.

Figure 2C:
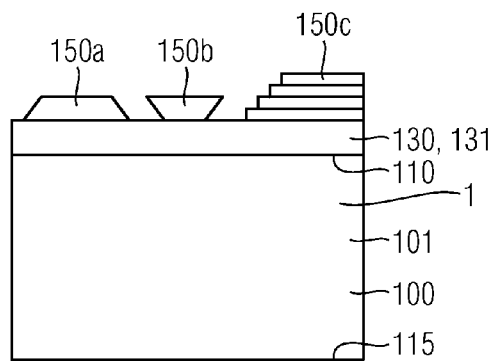
FIG. 2C illustrates a semiconductor substrate when performing a method according to a further embodiment.

FIG. 2C shows a further embodiment according to which the mask layer 150 comprises masking structures 150a, 150b or 150c having a varying thickness and thus resulting in a varying doping concentration of nitrogen ions 135. For example, the masking structure 150a has inclined sidewalls. Accordingly, a nitrogen doping or implantation dose is weakened with respect to uncovered portions but larger than in portions having a horizontal surface. In a corresponding manner, also the masking structure 150b has angled sidewalls. The angled sidewalls may have a continuously decreasing or increasing thickness as exemplified by masking structures 150a, 150b. According to a further modification, masking structure 150c has a stepwise increasing thickness. Thereby, the implementation dose with nitrogen may be varied.

Figure 3A:
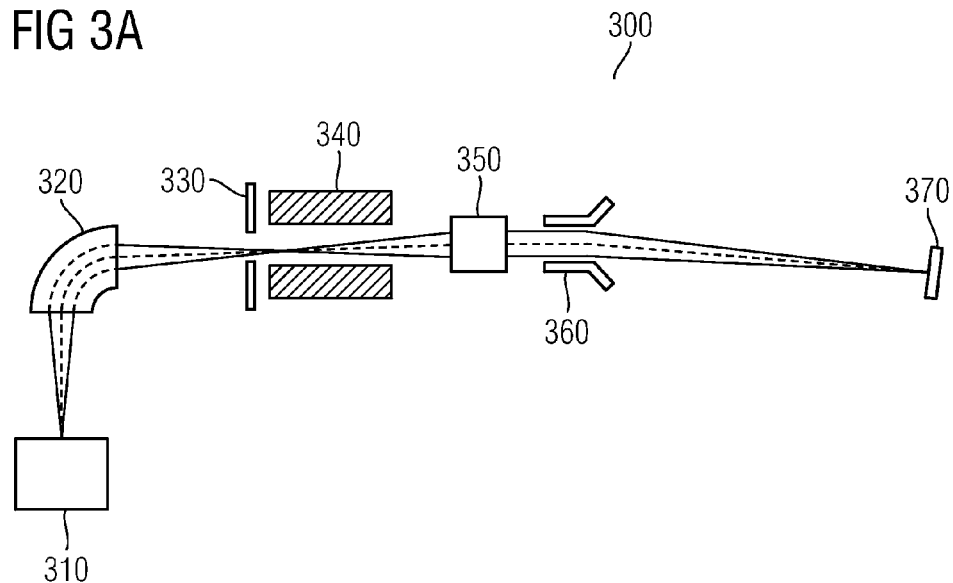
FIG. 3A illustrates a device that may be used for performing the method according to an embodiment.

FIG. 3A illustrates an example of a ion implantation apparatus 300 which may be used for performing the described doping process or process for introducing nitrogen. Nitrogen molecules are ionized within a gas discharge chamber 310. The nitrogen ions 135 are accelerated towards a substrate 370 by means of a suitable electrical field that may be generated by an acceleration tube 340. For example, the beam may be shaped and deflected using the magnetic devices 320, 350, 360. Further, the device may comprise a slit 330 for beam control. The magnetic devices may comprise a vertical scanner 350 as well as a horizontal scanner 360.

Figure 3B:
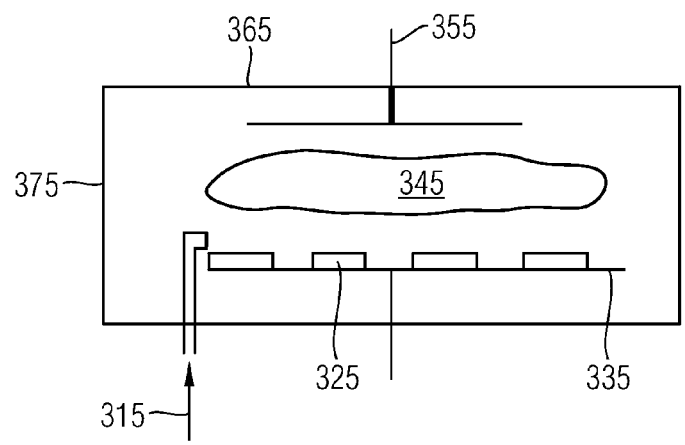
FIG. 3B illustrates a device that may be used for performing a method according to a further embodiment.

FIG. 3B shows an example of a device for performing a plasma assisted doping process that may be used for introducing nitrogen. As is shown, a plasma 345 may be generated above the substrate 325 that is held in a reaction chamber 375. For example, the plasma may be generated using a RF voltage that is applied to the upper electrode 355. A reaction gas such as nitrogen is fed via the gas inlet 315. By using the plasma assisted doping process (PLAD), a higher dose may be doped within a shorter time. The penetration depth of the nitrogen ions is smaller than using an implementation method.

Generally, in the ion implantation apparatus shown in FIG. 3A and the plasma assisted doping apparatus illustrated in FIG. 3B, a typical implantation time is 30 min to 1 h.

Figure 4A:
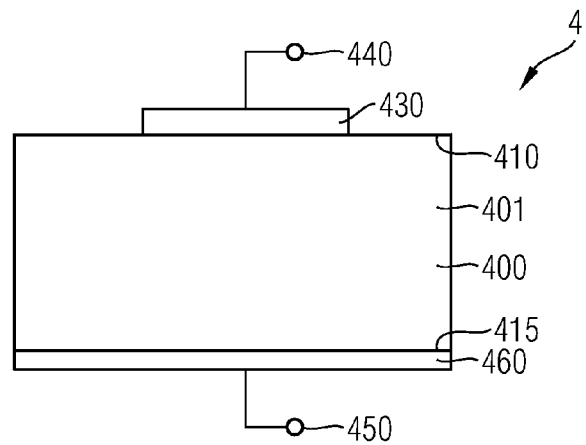
FIG. 4A illustrates a cross-sectional view of an example of a semiconductor device according to an embodiment.

FIG. 4A shows a cross-sectional view of a semiconductor device 4 according to an embodiment. The semiconductor device illustrated in FIG. 4A comprises a semiconductor material 400 and a metal nitride layer 430 in contact with the semiconductor material 400. As has been explained above, the metal nitride layer 430 has a nitrogen content larger than the solubility limit. For example, the content of nitrogen may be larger than 48 at-%, e.g. larger than 50 at-% or larger than 55 at-%. For example, a non-ohmic contact may be formed between the semiconductor material 400 and the metal nitride layer 430. According to another embodiment, an ohmic contact may be formed between the semiconductor material 400 and the metal nitride layer 430. A bandgap of the semiconductor material 400 may be larger than 2 eV and less than 10 eV.

The semiconductor material 400 may be a semiconductor body 401 including one or more doped portions or layers at either side thereof. The doped portion may be formed by various methods such as ion implantation, diffusion and epitaxial growth of the doped layer. For example, the semiconductor material may be a material having a bandgap larger than 2 eV. By way of example, the semiconductor material may comprise silicon carbide, diamond, gallium nitride, indium phosphide, AlGaAs and further examples of III-V semiconductors.

For example, the semiconductor body 401 may be heavily n-doped and may comprise a portion that is n-doped at a lower doping level, the portion being disposed at a first surface 410 of the semiconductor body. The metal nitride layer 430 may comprise a mixture of $M_xN_y$ having different values for x and y, wherein M denotes the metal. For example, the metal nitride layer may comprise a mixture of MN and $M_xN_y$, or of $MN_2$ and $M_xN_y$. Generally, in these formulas, x may be equal to 1, and y may be a real number fulfilling 0<y<3. Alternatively, y may be equal to 1, and x may be a real number fulfilling 0<x<3. For example, the metal may be selected from the group of molybdenum, titanium, tantalum, and tungsten. Further, the metal nitride may comprise two metals, such as MoTiN.

The metal nitride layer 430 may be electrically connected to an anode terminal. Further, the semiconductor device 4 may comprise a back side metallization 460 which forms an ohmic contact to the semiconductor body 401. The back side metallization 460 is disposed at a second surface 415 of the semiconductor body 401, opposite to the first surface 410. The back side metallization 460 may be electrically connected to a cathode terminal. The terms "ohmic contact", "Schottky contact", and "rectifying contact" will be explained below, while referring to FIGS. 5A and 5B.

Figure 4B:
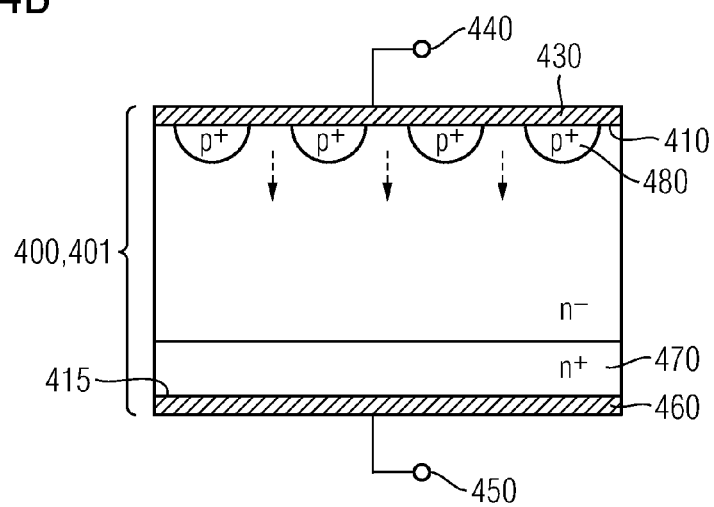
FIG. 4B shows a cross-sectional view of a semiconductor device according to a further embodiment.

FIG. 4B shows a further embodiment of a semiconductor device 4. The semiconductor device 4 illustrated in FIG. 4B comprises a semiconductor material 400, e.g. a semiconductor body 401 and a metal layer 430 in contact with the semiconductor material. The metal nitride layer 430 comprises a metal nitride and a non-ohmic contact is formed between the semiconductor material 400 and the metal layer 430. The metal nitride layer 430 has a nitrogen content larger than a solubility limit of nitrogen in the metal nitride.

Generally, the semiconductor material 400 may be a semiconductor body 401 including further doped portions. For example, these doped portions may be disposed adjacent to a first surface 410 or a second surface 415 of the semiconductor body 401. Differing from the embodiment of FIG. 4A, the semiconductor device 4 of FIG. 4B further comprises a doped region 480 of the second conductivity type. For example, the semiconductor material 400 may be n⁻-doped and the doped portion 480 may be p⁺-doped. The doped portion 480 may be disposed at the first surface 410 of the semiconductor body 401, and portions of the semiconductor material 400, which is e.g. n⁻-doped may be present at the first surface 410. The metal layer 430 may be in contact with the semiconductor material 400 and the doped portions 480. The semiconductor device 4 illustrated in FIG. 4B further comprises a heavily n⁺-doped region 470 at the second surface of the semiconductor body 401. The semiconductor device further comprises a back side metallization layer 460 that forms an ohmic contact to the doped layer 470. The back side metallization layer 460 may be electrically connected to a cathode terminal. The metal layer 430 may be electrically connected to an anode terminal. The semiconductor material may comprise any of the materials mentioned above. For example, the semiconductor material may be silicon carbide.

The semiconductor device illustrated in FIG. 4B may implement a Junction-Barrier Schottky (JBS) diode including p⁺ implanted portions 480. When a reverse voltage is applied to the semiconductor device, depletion regions formed at the interface between the n⁻ portion 400 and the p⁺ portion 480 pinch off a leakage current which may arise from the Schottky contact of the device. Accordingly, such a Junction-Barrier Schottky diode has a reduced leakage current. Such a JBS may be suitably used in a switched mode power supply.

Figure 4C:
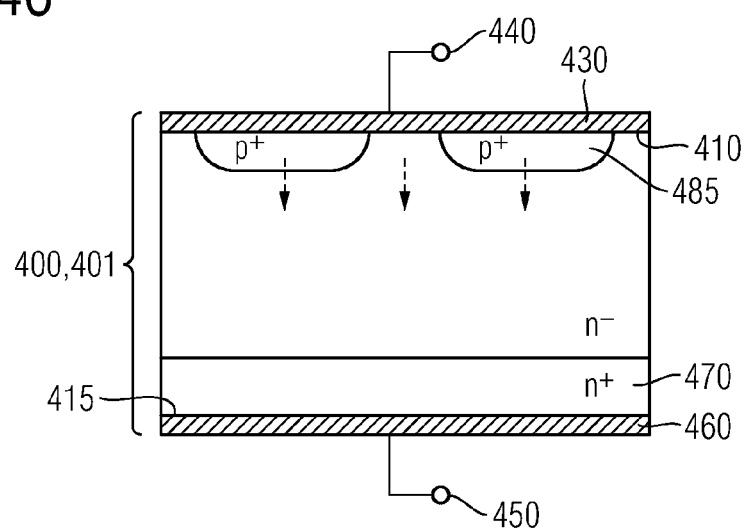
FIG. 4C shows a cross-sectional view of a semiconductor device according to a further embodiment.

According to a further embodiment, the semiconductor device 4 may implement a merged PIN Schottky diode (MPS). FIG. 4C shows a cross-sectional view of such a merged PIN Schottky-Diode. The MPS comprises similar components as the JBS, these components having the same reference numerals as the corresponding components of the JBS. In particular, the p⁺ portions 485 of the MPS are configured to inject minority carriers into the n⁻ portion 400 in forward direction. For example, the p⁺ portions 485 may be doped at a high doping concentration, e.g. $10^{19}$ to $10^{20}$ cm⁻³.

Figure 4D:
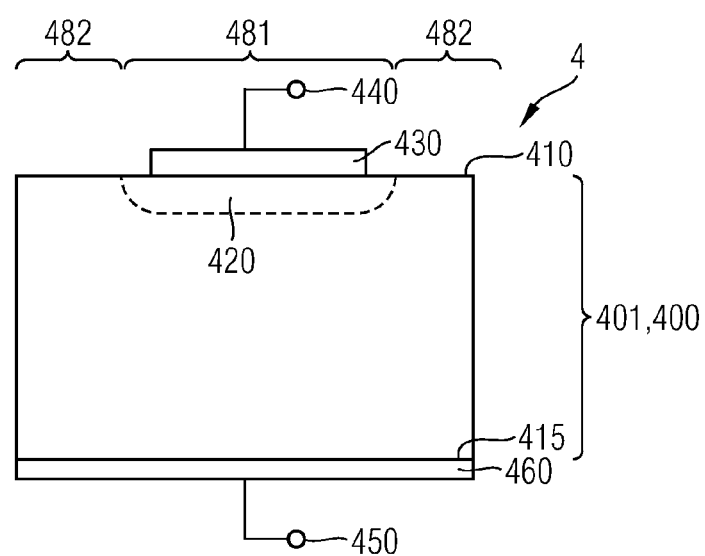
FIG. 4D shows a cross-sectional view of a semiconductor device according to a further embodiment.

FIG. 4D illustrates a further example of a semiconductor device. As is shown, the semiconductor device 4 comprises a semiconductor body 401 comprising a semiconductor material having a bandgap larger than 2 eV and less than 10 eV, a metal layer 430 in contact with a first surface 410 of the semiconductor body 401, the metal layer 430 comprising a metal nitride. The metal nitride layer 430 has a nitrogen content larger than a solubility limit of nitrogen in the metal nitride. The metal layer 430 is electrically connected to a first load terminal 440. A non-ohmic contact is formed between the semiconductor body 401 and the metal layer 430. A second surface 415 of the semiconductor body 401 is electrically connected to a second load terminal 450. The second surface 415 is opposite to the first surface 410. For example, the metal layer 430 may be in contact with a doped portion 420. According to an embodiment, the semiconductor body 401 may be heavily n⁺-doped and may be of an n-conductivity type. The doped portion 420 may be of an n-conductivity type, at a lower concentration of the n-type dopants.

For example, the semiconductor device shown in FIG. 4D may implement a Schottky-diode or a Schottky-diode related device. In this case, the first load terminal 440 may be an anode terminal, and the second load terminal 450 may be a cathode terminal. Depending from different implementations of the semiconductor device, the first load terminal 440 may be a source terminal and the second load terminal 450 may be a drain terminal, e.g. in the case of a MOSFET (metal oxide semiconductor field effect transistor) or a JFET (junction field effect transistor). According to a further example, the first load terminal 440 may be an emitter terminal, and the second load terminal 450 may be a collector terminal, e.g. in the case of an IGBT (insulated gate bipolar transistor).

The semiconductor device may comprise an active region 481 and a junction terminal area 482. In the active region 481, the metal layer 430 is in contact with the semiconductor body 401. The junction terminal area 482 is different from the active region 481 with regard to function and structure. To be more specific, in the active region 481, a load terminal of the semiconductor device, e.g. the anode terminal is electrically connected to the semiconductor body for the purpose of current conduction. In contrast, the purpose of the junction termination area is edge termination for reducing the electric field peak at the periphery of the semiconductor device 4. Typical structural elements of the junction termination area include one or more of field plates, ring structures such as floating guard rings or ring segments, junction termination extension (JTE) structures and variation of lateral doping (VLD) structures, for example.

Figure 5A:
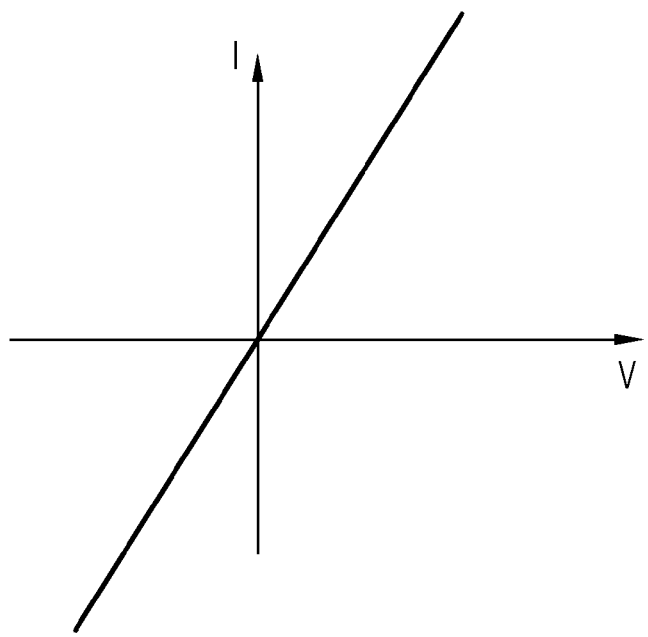
FIG. 5A illustrates an example of a current-voltage characteristic of an ohmic contact.

FIG. 5A shows an example of a current-voltage characteristic of an ohmic contact. As can be seen, the current is approximately proportional with respect to the applied voltage. The ratio of voltage and current is denoted as the resistance of the contact.

Figure 5B:
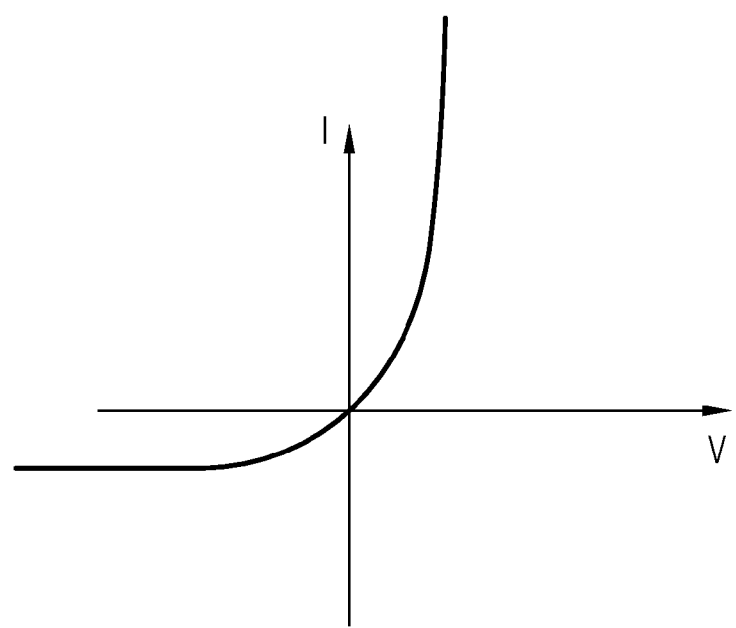
FIG. 5B illustrates a cross-sectional view of a rectifying contact.

On the other hand, as is illustrated in FIG. 5B, across a non-ohmic contact the current need not to be proportional with respect to the voltage. Rather, as can be seen on the left-hand side of the chart illustrated in FIG. 5B, almost no current may be flowing, independent from the negative voltage applied. Further, when applying a positive voltage, the current may increase in a non-linear manner. Any kind of current-voltage characteristics in which the current is non-linear to the applied voltage, may be regarded as establishing a non-ohmic contact. For example, the contact may be a rectifying contact such as, for example, a pn junction or a Schottky junction, in which only a small current, i.e. the reverse saturation current flows, when a low voltage in a reverse direction is applied. When a higher voltage is applied in the reverse direction, a breakdown current may flow.

In the context of the present specification, the term "non-ohmic contact" is understood to represent any kind of contact having a non-linear current-voltage characteristics. According to a further modification, the term "rectifying contact" is considered to represent any kind of contact according to which only a little or no current flows, when a voltage in a reverse direction is applied, the current not being proportional with respect to the applied voltage.

Figure 6:
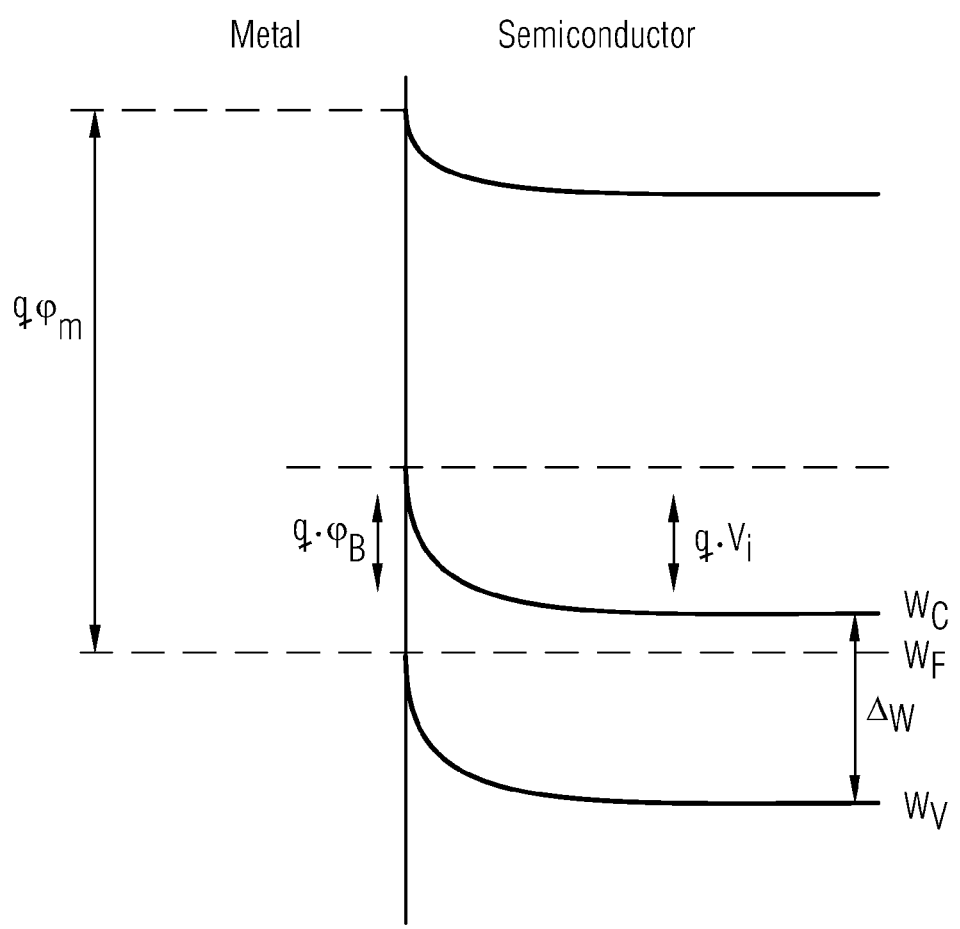
FIG. 6 illustrates an energy band diagram of a Schottky contact.

FIG. 6 shows an example of an energy band diagram of a rectifying metal semiconductor junction. The right-hand side of FIG. 6 shows the energy band diagram within the semiconductor material, wherein $W_C$ denotes the energy level of the conduction band, $W_V$ denotes the energy level of the valence band and $W_F$ denotes the Fermi level of the semiconductor material. The difference $\Delta W$ between the energy level $W_C$ of the conduction band and the energy level $W_V$ of the valence band denotes the bandgap of the semiconductor material. The left-hand portion of the energy band diagram of FIG. 6 shows the work function $q \times \varphi_M$ of the metal. When the metal and the semiconductor material form a junction, a potential barrier is generated at the interface between the Fermi level of the metal $W_F$ and the valence band of the semiconductor material. The height of the potential barrier $q \times \varphi_B$ also is referred to as the "Schottky barrier" of the contact.

Generally, Schottky contacts including a semiconductor material having a wide bandgap have a large forward voltage drop due to the work function and the Schottky barrier of the contact metals used. According to the described embodiment, by selecting a metal layer including a metal nitride, the height of the Schottky barrier may be adjusted. In particular, by varying the nitrogen content of the metal nitride, the work function of the metal may be suitably set. As a consequence, the Schottky barrier and hence, the forward voltage drop may be set by setting the nitrogen content of the metal nitride. For example, the nitrogen content of the metal nitride may be larger than 45 at-%, in particular, larger than the limit of solubility of nitrogen in the metal nitride. For example, the nitrogen content may be determined using Auger ion spectroscopy, secondary ion mass spectroscopy (SIMS) or X-Ray Photoelectron Spectroscopy (XPS).

The semiconductor device may be a semiconductor component which may be selected from the group consisting of a Schottky diode, a merged pn Schottky diode, a JFET, an integrated flyback diode, a rectifier, an inverter and a power supply.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device, comprising:
   a semiconductor material comprising a first region of a first conductivity type at a main surface, and a second region of a second conductivity type at the main surface, the second conductivity type being different from the first conductivity type; and
   a metal nitride layer in contact with the main surface, the metal nitride layer comprising a first layer portion adjacent to the first region and a second layer portion adjacent to the second region, a nitrogen content of the first layer portion being different from a nitrogen content of the second layer portion, and the nitrogen content of the first layer portion being larger than 50 at. %.

2. The semiconductor device according to claim 1, wherein the metal nitride layer comprises a metal selected from the group consisting of molybdenum, titanium, tantalum, and tungsten.

3. The semiconductor device according to claim 1, wherein a non-ohmic contact is formed between the semiconductor material and the metal nitride layer.

4. The semiconductor device according to claim 1, wherein a Schottky contact is formed between the semiconductor material and the metal nitride layer.

5. The semiconductor device according to claim 1, wherein the nitrogen content of the first layer portion is larger than 60 at. %.

6. The semiconductor device according to claim 1, wherein the semiconductor material has a bandgap larger than 2 eV and less than 10 eV.

7. An electrical component comprising the semiconductor device of claim 1, wherein the electrical component is selected from the group consisting of a Schottky diode, a merged Schottky diode, a junction barrier Schottky diode, a JFET, a MESFET, an integrated flyback diode, a rectifier, an inverter, and a power supply.

8. The semiconductor device according to claim 1, wherein the first layer portion has a nitrogen content larger than a solubility limit of nitrogen in the metal nitride layer.

9. A semiconductor device, comprising:
   a semiconductor material comprising a first region of n conductivity type at a main surface, and a second region of p conductivity type at the main surface; and
   a metal nitride layer in contact with the main surface, the metal nitride layer comprising a first layer portion adjacent to the first region and a second layer portion adjacent to the second region, a nitrogen content of the first layer portion being smaller than a nitrogen content of the second layer portion, wherein the nitrogen content of the second layer portion is larger than 50 at. %.

10. The semiconductor device according to claim 9, wherein the metal nitride layer comprises a metal selected from the group consisting of molybdenum, titanium, tantalum, and tungsten.

11. The semiconductor device according to claim 9, wherein a non-ohmic contact is formed between the semiconductor material and the metal nitride layer.

12. The semiconductor device according to claim 9, wherein a Schottky contact is formed between the semiconductor material and the metal nitride layer.

13. The semiconductor device according to claim 9, wherein the nitrogen content of the second layer portion is larger than 60 at. %.

14. The semiconductor device according to claim 9, wherein the semiconductor material has a bandgap larger than 2 eV and less than 10 eV.

15. The semiconductor device according to claim 9, wherein an impurity concentration of the second region is larger than that of the first region.

16. An electrical component comprising the semiconductor device of claim 9, wherein the electrical component is selected from the group consisting of a Schottky diode, a merged Schottky diode, a junction barrier Schottky diode, a JFET, a MESFET, an integrated flyback diode, a rectifier, an inverter, and a power supply.

17. The semiconductor device according to claim 9, wherein the second layer portion has a nitrogen content larger than a solubility limit of nitrogen in the metal nitride layer.

18. A semiconductor device, comprising:
   a semiconductor material comprising a first region of n conductivity type at a main surface, and a second region of p conductivity type at the main surface; and
   a conductive metal layer in contact with the main surface, the conductive metal layer comprising a first layer portion adjacent to the first region and a second layer portion adjacent to the second region, a nitrogen content of the first layer portion being smaller than a nitrogen content of the second layer portion, wherein the nitrogen content of the second layer portion is larger than 50 at. %.

19. The semiconductor device according to claim 18, wherein the conductive metal layer comprises a metal selected from the group consisting of molybdenum, titanium, tantalum, and tungsten.

20. The semiconductor device according to claim 18, wherein the nitrogen content of the second layer portion is larger than 60 at. %.

21. The semiconductor device according to claim 18, wherein the second layer portion has a nitrogen content larger than a solubility limit of nitrogen in the conductive metal layer.

* * * * *